(12) United States Patent
Lee et al.

(10) Patent No.: US 8,420,543 B1
(45) Date of Patent: Apr. 16, 2013

(54) METHOD FOR TREATING THE DISLOCATION IN A GAN-CONTAINING SEMICONDUCTOR LAYER

(75) Inventors: Wei-I Lee, Hsinchu (TW); Yen-Hsien Yeh, New Taipei (TW); Yin-Hao Wu, Taichung (TW); Tzu-Yi Yu, Taichung (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/346,807

(22) Filed: Jan. 10, 2012

(30) Foreign Application Priority Data

Oct. 24, 2011 (TW) .............................. 100138511 A (51) Int. Cl.
*H01L 21/302* (2006.01)
*H01L 21/461* (2006.01)
(52) U.S. Cl.
USPC ............ 438/704; 257/E21.108; 257/E21.119; 257/E21.121; 257/E21.133; 257/E21.218; 257/E21.22; 257/E21.222; 257/E21.245; 438/341; 438/478; 438/481; 438/706; 438/734; 438/745
(58) Field of Classification Search ........... 257/E21.108, 257/E21.119, E21.121, E21.133, E21.218, 257/E21.219, E21.22, E21.222, E21.245; 438/341, 478, 481, 704, 706, 734, 745
See application file for complete search history.

(56) References Cited

U.S. PATENT DOCUMENTS

| 2004/0089919 A1 * | 5/2004 | Motoki et al. ................. 257/613 |
| 2007/0259504 A1 * | 11/2007 | Bour et al. .................... 438/341 |

* cited by examiner

*Primary Examiner* — Asok K Sarkar
(74) *Attorney, Agent, or Firm* — Bacon & Thomas, PLLC (57) ABSTRACT

A method for treating the threading dislocation within a GaN-containing semiconductor layer is provided. The method includes a substrate is provided. A GaN-containing semiconductor layer with the threading dislocation is formed on the substrate. An etching process with an etching gas is performed to remove the threading dislocation in the GaN-containing semiconductor layer so as to increase the efficiency for the light emitting device.

3 Claims, 8 Drawing Sheets

METHOD FOR TREATING THE DISLOCATION IN A GAN-CONTAINING SEMICONDUCTOR LAYER

BACKGROUND OF THE INVENTION

1. Field of the Invention

The invention relates to a method for fabricating a semiconductor device, particularly to a method for treating the threading dislocation within a GaN-containing semiconductor layer.

2. Description of the Prior Art

At present, it is a well-known technique for employing the GaN-containing semiconductor in the light emitting device, due to the GaN-containing semiconductor is able to emit shortwave light for the range from ultraviolet to turquoise. In the future, these light emitting devices, such as light emitting diode or laser diode may be regarded as the luminescence and display devices, or regarded as the light sources of DVD for the next generation.

However, the gallium nitride (GaN) is often used in the nitride-containing semiconductor, because of lacking the lattice-matched substrate, thus it is often grown up on the lattice-mismatched sapphire substrate. Due to the lattice is matched between the gallium nitride and sapphire, thus a large amount of threading dislocation is exited in the epitaxy layer, so that the efficiency of the device is decreased.

Therefore, in order to decrease the dislocation of GaN-containing semiconductor and increase the production efficiency, it is necessary to develop the innovative dislocation removal technique, so as to decrease the time of research and develop as well as the manufacturing cost of device.

SUMMARY OF THE INVENTION

According to the shortcoming of the prior art, the main purpose of the invention is to disclose a treatment method to remove the threading dislocation in the GaN-containing semiconductor layer so as to improve the problem for the efficiency decrease of device.

Another purpose of the invention is to provide a method for treating the GaN-containing semiconductor layer by a gas under specific temperature and pressure. An etching process with an etching gas is performed to remove the threading dislocation in the GaN-containing semiconductor layer. After etching, the GaN-containing semiconductor layer with low dislocation density is formed, in order to increase the efficiency of the semiconductor device.

According to the above-mentioned purpose, the invention provides a method for treating the threading dislocation within a GaN-containing semiconductor layer is provided. The method includes: the followings a substrate is provided. A GaN-containing semiconductor layer with the threading dislocation is formed on the substrate. An etching process with an etching gas is performed to remove the threading dislocation in the GaN-containing semiconductor.

In an embodiment of invention, the above-mentioned GaN-containing semiconductor layer is formed on the substrate by the high-temperature furnace tube, Metal-Organic Chemical Vapor Deposition (MOCVD), Molecular Beam Epitaxy (MBE), or Hydride Vapor Phase Epitaxy (HVPE).

In an embodiment of invention, the above-mentioned substrate can be the single-crystal substrate of sapphire, silicon carbide, silicon, lithium aluminate (LiAlO2), and zinc oxide.

In an embodiment of invention, the above-mentioned GaN-containing semiconductor layer is GaN-containing semiconductor epitaxy layer.

In an embodiment of invention, the above-mentioned GaN-containing semiconductor layer includes the free-standing GaN substrate, GaN bulk, or single crystal GaN.

In an embodiment of invention, the structure of the above-mentioned single crystal GaN includes the Wurtzite, Zinc Blende, or rock salt.

In an embodiment of invention, the above-mentioned etching gas includes the hydrogen, halogen, hydrogen halide, or halide gas.

In an embodiment of invention, the temperature range of the above-mentioned etching process is 800° C. to 1200° C.

In an embodiment of invention, the pressure range of the above-mentioned etching process is 10 torr to 800 torr.

In an embodiment of invention, an inert gas is introduced to the above-mentioned etching process.

In an embodiment of invention, the above-mentioned inert gas includes the helium, nitrogen, and argon.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some embodiments of the invention will be described as follows in detail. However, besides describing in detail, the invention can also be widely implemented in other embodiments, and the range of the invention is not limited, it is subject to future patent range.

The GaN-containing semiconductor layer is often grown up on the substrate with mismatched lattice, such as the sapphire substrate. Due to the lattice is matched between the gallium nitride and sapphire, thus a large amount of threading dislocation is exited in the epitaxy layer, so that the efficiency of the device is decreased. In order to improve the dislocation of GaN-containing semiconductor, the invention provides a method for treating the threading dislocation in the GaN-containing semiconductor layer. Please refer to FIG. 1A at first.

Figure 1A:
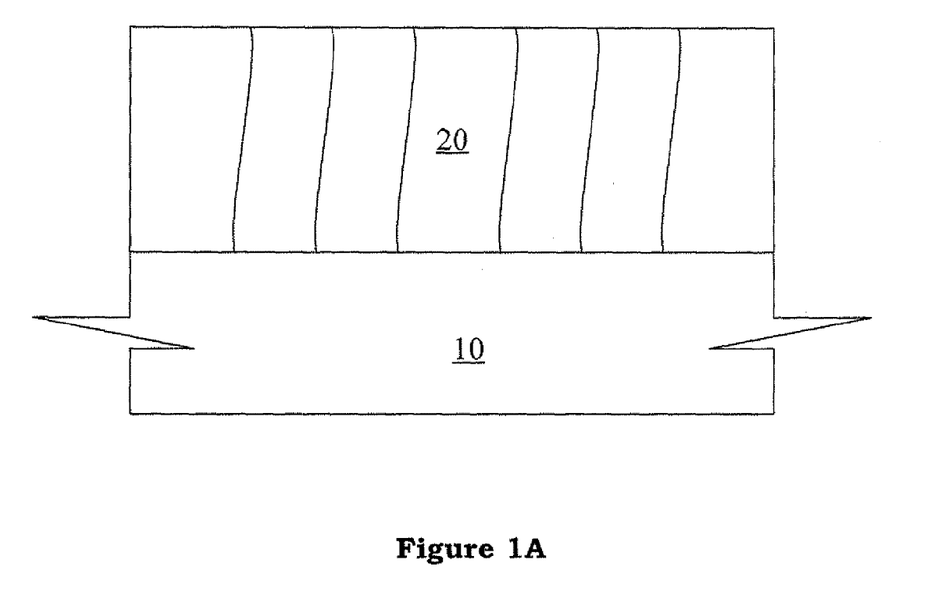
FIG. 1A shows the GaN-containing semiconductor layer with dislocation is formed on the substrate in accordance with the technique disclosed in the invention.

As shown in FIG. 1A, a substrate 10 is provided. A GaN-containing semiconductor layer 20 is formed on the substrate. The substrate 10 can be the single-crystal substrate of sapphire, silicon carbide, silicon, lithium aluminate (LiAlO2), and zinc oxide. The GaN-containing semiconductor layer 20 can be GaN-containing semiconductor epitaxy layer, which at least includes n-type GaN semiconductor layer, n-type cladding layer, active layer, p-type cladding layer, and p-type contact layer. In addition, the GaN-containing semiconductor layer 20 can be the free-standing GaN substrate, GaN bulk, or single crystal nitride semiconductor. The structure of the single crystal nitride semiconductor includes the Wurtzite, Zinc Blende, or rock salt.

As shown in FIG. 1A, in an example of GaN-containing semiconductor epitaxy layer, the method for forming the GaN-containing semiconductor layer 20 the substrate 10 includes the high-temperature furnace tube, Metal-Organic Chemical Vapor Deposition (MOCVD), Molecular Beam Epitaxy (MBE), or Hydride Vapor Phase Epitaxy (HVPE).

Figure 1B:
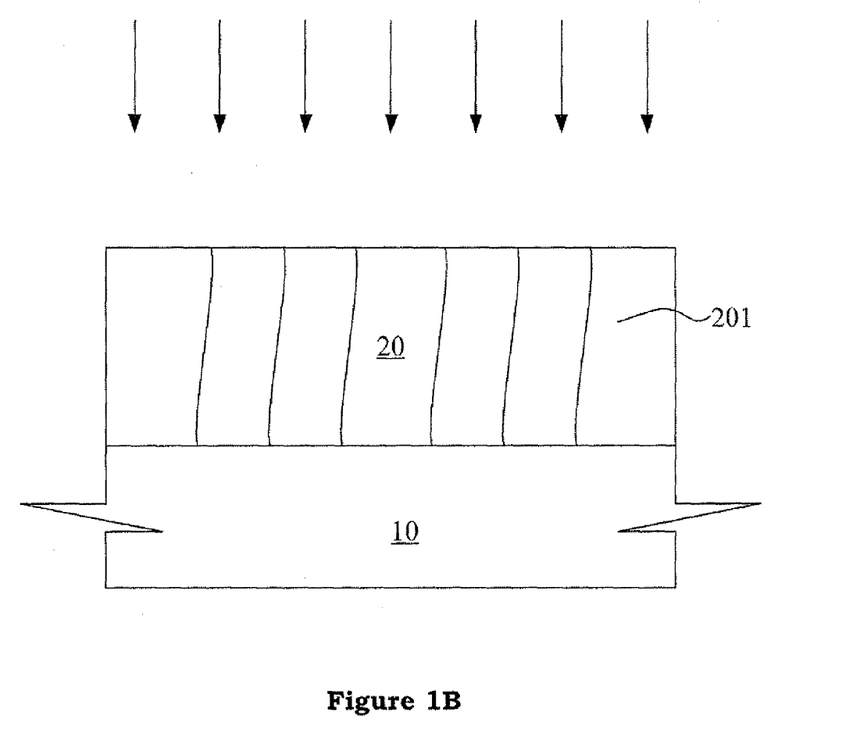
FIG. 1B shows the dislocation in GaN-containing semiconductor layer is removed by the etching process in accordance with the technique disclosed in the invention.

As shown in FIG. 1B, in order to remove the dislocation 201 in GaN-containing semiconductor layer 20, the GaN-containing semiconductor layer 20 formed by the MOCVD is placed in the HVPE system and heated up. When the temperature reached to 800° C. to 1200° C. (1050° C. is preferred), the etching gas and inert gas are introduced, and the pressure in the reactor (not shown in the figure) is controlled between 10 torr to 800 torr (100 torr is preferred) for 10 minutes. When the operation time is achieved, the supply of etching gas and inert gas is stopped, and the temperature of reactor is reduced.

Figure 1C:
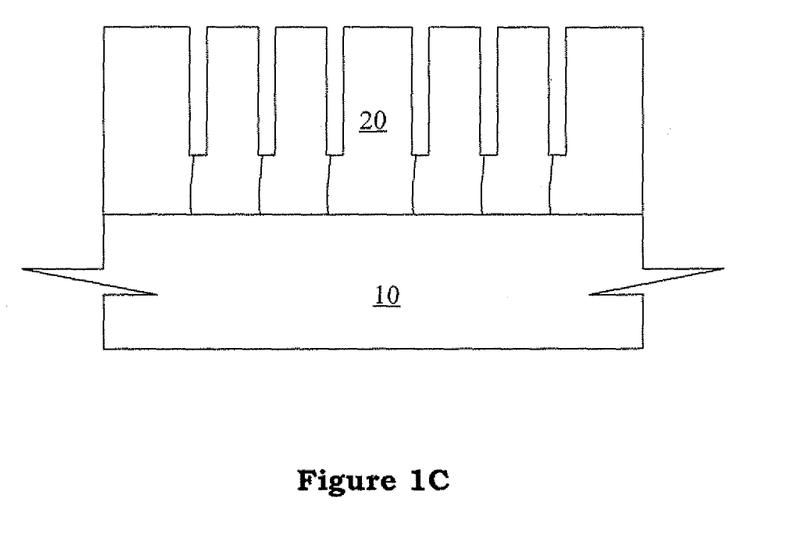
FIG. 1C shows the GaN-containing semiconductor layer after the etching process in accordance with the technique disclosed in the invention.

The above-mentioned etching gas includes the hydrogen, halogen, hydrogen halide, or halide gas. In this embodiment, the hydrogen is used as the etching gas, and the flow rate to the reactor is 0.3~3 slm. In addition, the hydrogen includes the fluorine, chlorine, bromine, or iodine. The hydrogen halide includes the hydrogen fluoride (HF), hydrogen chloride (HCl), hydrogen bromide (HBr), or hydrogen iodide (HI). The halide gas includes the boron trichloride (BCl3). The inert gas includes the helium, nitrogen, and argon, and the flow rate to the reactor is 3~6 slm. The result after etching is shown in FIG. 1C.

Then the etched GaN-containing semiconductor layer 20 is immersed in the acid solution (not shown in the figure) for about 15 minutes to 30 minutes. The acid solution is mixed by 1:3 of phosphoric acid and sulfuric acid.

Figure 2:
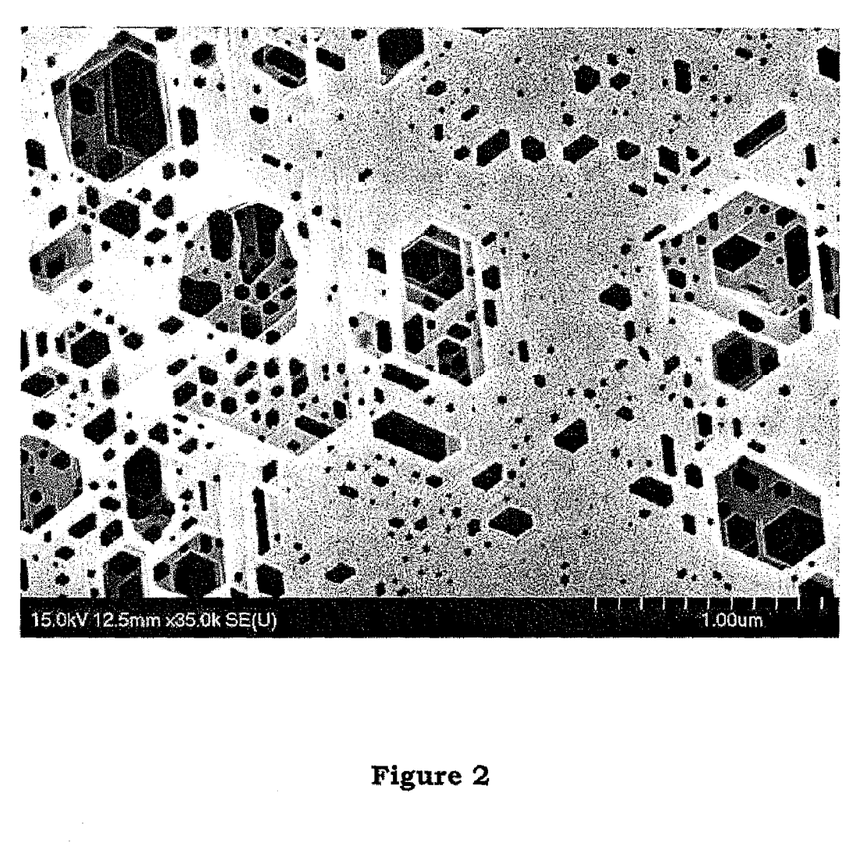
FIG. 2 shows the SEM diagram of GaN-containing semiconductor layer after it is immersed in the acid solution in accordance with the technique disclosed in the invention.

FIG. 2 shows the Scanning Electron Microscope (SEM) diagram of GaN-containing semiconductor layer 20 after it is immersed in the acid solution. The technique used to etch the dislocation on the surface of GaN-containing semiconductor layer 20 by the acid solution is called the etch pit density (EPD) technique. This technique will etch the dislocation on the surface of GaN-containing semiconductor layer 20 into the V-shape pit. FIG. 2 shows the original dislocation on the surface of GaN-containing semiconductor layer is etched from small pit to larger pit by the acid solution. The part without pit will not be etched by the acid solution. It means that the etching gas begins from the dislocation part. Thus the dislocations on the surface of GaN-containing semiconductor layer 20 have already been etched into the cylindrical pits. By the way, although some small pits are not dislocations on the surface of GaN-containing semiconductor layer 20, they will also be etched in the gas etching process.

Figure 3:
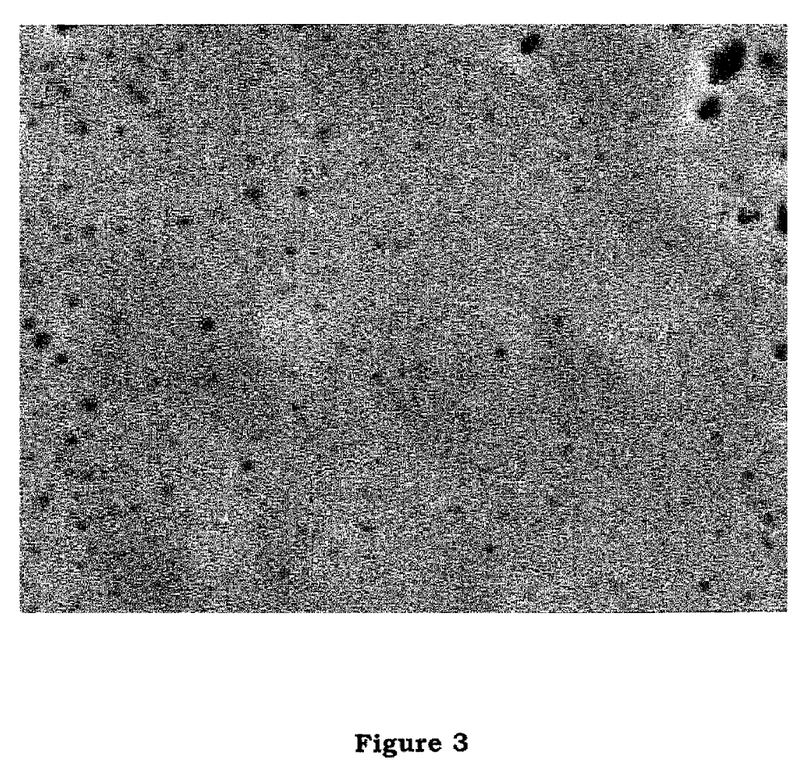
FIG. 3 shows the SEM diagram of GaN-containing semiconductor layer after it is etched in accordance with the technique disclosed in the invention.

FIG. 3 shows the Scanning Electron Microscope (SEM) diagram of GaN-containing semiconductor layer after it is etched. The CL-mapping for the same position by the cathode ray emitting (or electron beam exciting) is shown in FIG. 4.

Figure 4:
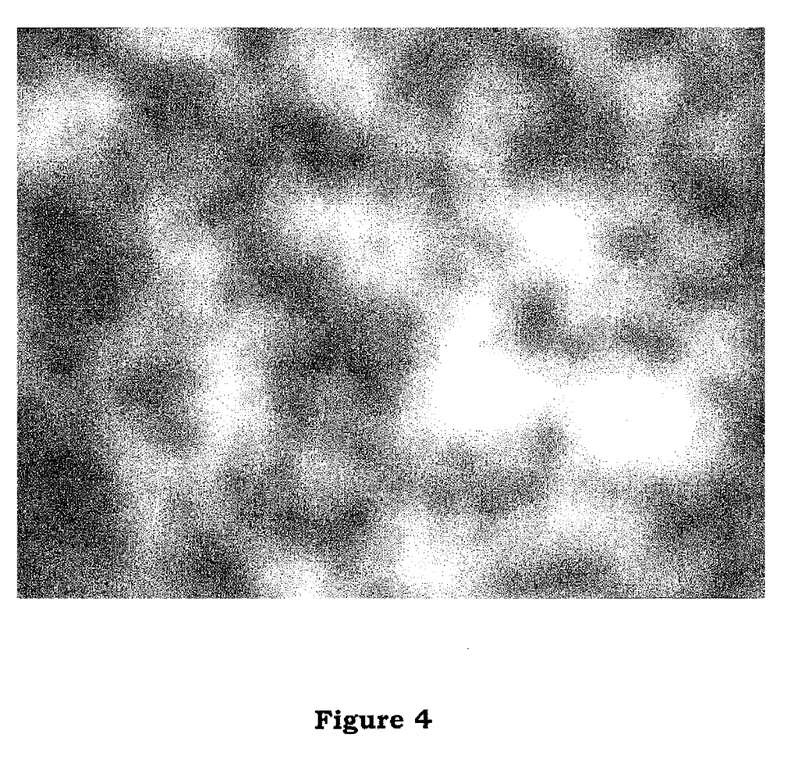
FIG. 4 shows the CL-mapping for the same position by the cathode ray emitting (or electron beam exciting) in accordance with the technique disclosed in the invention.

As shown in FIG. 4, the black position can be corresponded to the pit shown in FIG. 3, otherwise it means some dislocations are not etched. However, these areas are not found in FIG. 4, it shows that all dislocations on the surface of GaN-containing semiconductor layer 20 are removed during the etching process.

Figure 5:
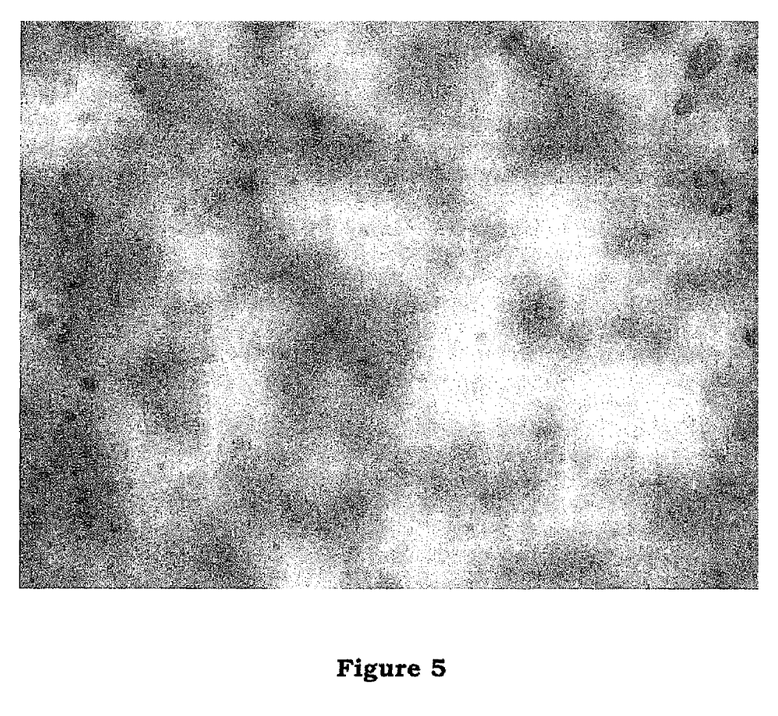
FIG. 5 shows the diagram overlapped by FIG. 3 and FIG. 4 in accordance with the technique disclosed in the invention.

In addition, in order to facilitate the observation, FIG. 3 and FIG. 4 are overlapped to form FIG. 5. The above-mentioned same result can be obtained from FIG. 5.

Figure 6:
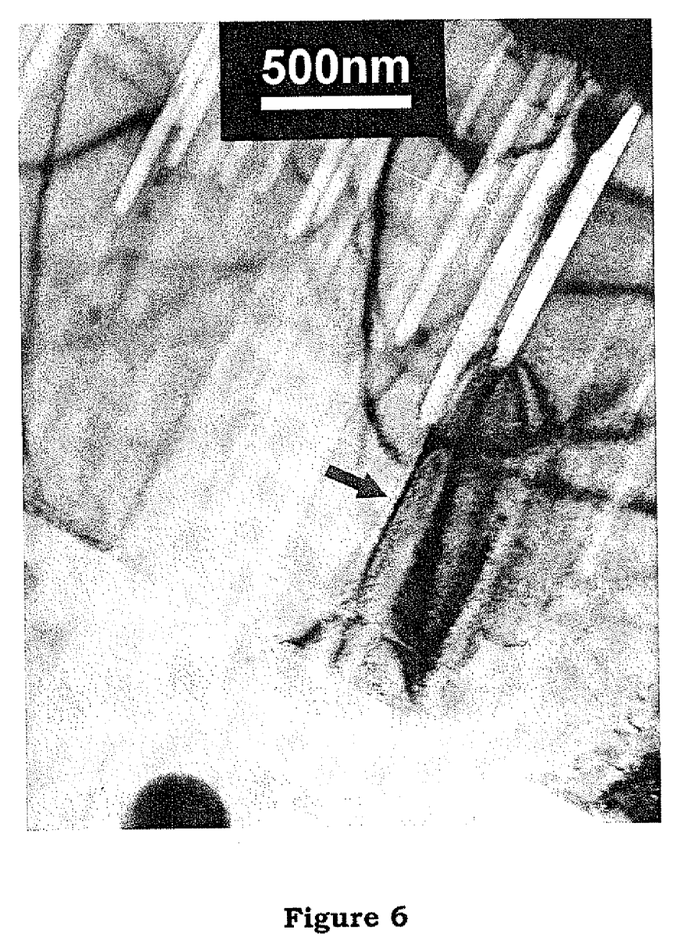
FIG. 6 shows the Transmission Electron Microscope (TEM) diagram of GaN-containing semiconductor layer after it is etched in accordance with the technique disclosed in the invention.

In addition, FIG. 6 shows the Transmission Electron Microscope (TEM) diagram of GaN-containing semiconductor layer 20 after it is etched. As shown in FIG. 6, a line of dislocation can be obtained on the surface of GaN-containing semiconductor layer (pointed by red arrow in the figure). This line of dislocation lies under the pit etched by the etching gas, which can prove that the etching gas will etch the dislocation.

In addition, treatment method for removing the threading dislocation disclosed by the invention can also be applied to the free-standing GaN or the GaN-containing semiconductor layer. Under the same condition, the etching gas can remove the threading dislocation in the free-standing GaN or GaN-containing semiconductor layer. Thus the dislocation-free GaN-containing semiconductor epitaxy layer, free-standing GaN, or GaN-containing semiconductor layer can be used for the photovoltaic or electronic device.

In addition, the etching gas disclosed in the invention can be applied to deal with the dislocation for the epitaxy layer of Multiple Quantum Wells (MQWs). After the dislocation in the epitaxy layer of Multiple Quantum Wells is removed by the etching gas, the Multiple Quantum Wells can be made into the light emitting device continuously, and its efficiency can be improved because of the removal of dislocation.

Therefore, the etching gas disclosed in the invention can remove the threading dislocation in the GaN-containing semiconductor layer and improve the efficiency of the device. In the manufacturing process of light emitting device, in order to prevent the efficiency decrease of device due to the dislocation, the etching process can be conducted after the Multiple Quantum Wells in GaN-containing semiconductor layer are formed, so as to remove the dislocation in the epitaxy layer of Multiple Quantum Wells, and improve the efficiency of the device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for treating the GaN-containing semiconductor epitaxy layer by using the etching process to remove the threading dislocation, comprising:
    providing a substrate, wherein the substrate being selected from the group consisting of silicon carbide, silicon, lithium aluminate (LiAlO$_2$), and single crystal zinc oxide substrate and free-standing GaN substrate;
    forming a GaN-containing semiconductor epitaxy layer with a threading dislocation on the substrate by using Molecular Beam Epitaxy (MBE) method;
    using an etching gas to perform an etching process to remove the threading dislocation in the GaN-containing epitaxy semiconductor, wherein the etching gas being selected from the group consisting of hydrogen, hydrogen halide, and halide gas, a temperature range for the etching process being 800° C. to 1200° C., a pressure range of the etching process being 10 torr to 800 torr for 10 minutes; and immersing the etched GaN-containing epitaxy semiconductor layer in an acid solution for about 15 minutes to 30 minutes, wherein the acid solution being mixed by 1:3 of a phosphoric acid and a sulfuric acid;

wherein the GaN-containing semiconductor epitaxy layer being selected from the group consisting of GaN bulk, n-type doping GaN-containing semiconductor layer, p-type doping GaN-containing semiconductor layer, Quantum Wells GaN-containing semiconductor layer, Multiple Quantum Wells GaN-containing semiconductor layer, and single crystal GaN.

2. The method according to claim 1, wherein the structure of the single crystal GaN is selected from the group consisting of Zinc Blende, and rock salt.

3. The method according to claim 1, wherein an inert gas is introduced to the etching process, wherein the inert gas is selected from the group consisting of nitrogen and argon.

* * * * *